United States Patent
Chan et al.

(10) Patent No.: US 11,210,971 B2
(45) Date of Patent: Dec. 28, 2021

(54) LIGHT EMITTING DIODE DISPLAY WITH TILTED PEAK EMISSION PATTERN

(75) Inventors: Chi Keung Chan, Sheung Shui (HK); Yue Kwong Lau, Laguna (HK); Zhang Zhikuan, Shatin (HK); Yan Xingtao, Huizhou (CN)

(73) Assignee: Cree Huizhou Solid State Lighting Company Limited, Huizhou (CN)

( * ) Notice: Subject to any disclaimer, the term of this patent is extended or adjusted under 35 U.S.C. 154(b) by 618 days.

(21) Appl. No.: 12/498,277

(22) Filed: Jul. 6, 2009

(65) Prior Publication Data
US 2011/0001149 A1    Jan. 6, 2011

(51) Int. Cl.
*G09F 9/33* (2006.01)
*H01L 33/48* (2010.01)
*G09F 9/302* (2006.01)
*H01L 33/54* (2010.01)
*H01L 33/60* (2010.01)

(52) U.S. Cl.
CPC .............. *G09F 9/33* (2013.01); *G09F 9/3026* (2013.01); *H01L 33/48* (2013.01); *H01L 33/54* (2013.01); *H01L 33/60* (2013.01); *H01L 2924/0002* (2013.01)

(58) Field of Classification Search
CPC ......... H01L 33/20; H01L 33/38; H01L 33/62; H01L 27/153–156; H01L 33/48; H01L 33/54; H01L 33/60; G09F 9/30; G09F 9/302; G09F 9/3026; G09F 9/33
USPC ....... 257/89–91, 98–100, E33.059, E33.066, 257/E33.067
See application file for complete search history.

(56) References Cited

U.S. PATENT DOCUMENTS

| | | | |
|---|---|---|---|
| 3,760,237 A | 9/1973 | Jaffe | 257/98 |
| 4,511,425 A | 4/1985 | Boyd | 156/493 |
| 4,946,547 A | 8/1990 | Palmour et al. | |
| 5,130,761 A | 7/1992 | Toshiaki | 357/17 |
| 5,200,022 A | 4/1993 | Kong et al. | |
| RE34,861 E | 2/1995 | Davis et al. | |
| 5,790,298 A | 8/1998 | Tonar | 359/267 |

(Continued)

FOREIGN PATENT DOCUMENTS

| | | |
|---|---|---|
| CN | 2498694 | 7/2002 |
| CN | 2646873 | 10/2004 |

(Continued)

OTHER PUBLICATIONS

Notification of First Office Action in application CN 200880009255.7 dated Sep. 26, 2010.

(Continued)

*Primary Examiner* — Monica D Harrison
(74) *Attorney, Agent, or Firm* — Withrow & Terranova, PLLC

(57) ABSTRACT

LED packages and LED displays utilizing the LED packages are disclosed where the peak emission of the LED display can be tilted or shifted to customize its peak emission to the mounting height or location of the LED display. One embodiment of an LED display comprises a plurality of LED package where the peak emission from at least some of the LED packages is tilted off the package centerline. The LED packages are mounted within the display in such a way as to generate an image having a peak emission that is tilted off the perpendicular emission direction of the display.

51 Claims, 10 Drawing Sheets

(56) References Cited

U.S. PATENT DOCUMENTS

| | | | |
|---|---|---|---|
| 5,813,753 A | 9/1998 | Vriens et al. | 362/293 |
| 5,959,316 A | 9/1999 | Lowery | 257/98 |
| 6,061,160 A | 5/2000 | Maruyama | 359/152 |
| 6,183,100 B1 | 2/2001 | Suckow et al. | 362/35 |
| 6,259,608 B1 | 7/2001 | Berardinelli et al. | |
| 6,296,367 B1 | 10/2001 | Parsons et al. | 362/183 |
| 6,359,236 B1 | 3/2002 | Distefano et al. | |
| 6,376,902 B1 | 4/2002 | Arndt | 257/678 |
| 6,454,437 B1 | 9/2002 | Kelly | 362/246 |
| 6,642,547 B2* | 11/2003 | Matsubara | H01L 33/28 257/103 |
| 6,707,069 B2 | 3/2004 | Song et al. | 257/79 |
| 6,710,373 B2 | 3/2004 | Wang | |
| 6,770,498 B2 | 8/2004 | Hsu | 438/26 |
| 6,791,259 B1 | 9/2004 | Stokes | |
| 6,995,510 B2 | 2/2006 | Murakami et al. | |
| 7,021,797 B2 | 4/2006 | Minano et al. | 362/355 |
| 7,119,422 B2 | 10/2006 | Chin | 257/666 |
| 7,190,004 B2 | 3/2007 | Nagai et al. | |
| 7,224,000 B2 | 5/2007 | Aanegola et al. | 257/98 |
| 7,285,802 B2 | 10/2007 | Ouderkirk et al. | 257/98 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,649,209 B2 | 1/2010 | Hussell et al. | |
| 8,362,512 B2 | 1/2013 | Hussell et al. | |
| 8,487,326 B2 | 7/2013 | Chan et al. | |
| 8,748,915 B2 | 6/2014 | Chan et al. | |
| 2002/0061174 A1 | 5/2002 | Hurt et al. | |
| 2003/0116769 A1 | 6/2003 | Song et al. | |
| 2003/0183852 A1 | 10/2003 | Takenaka | |
| 2004/0037076 A1 | 2/2004 | Katoh et al. | |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0211970 A1 | 10/2004 | Hayashimoto et al. | |
| 2004/0217364 A1 | 11/2004 | Tarsa | |
| 2004/0227149 A1 | 11/2004 | Ibbetson | |
| 2005/0072981 A1 | 4/2005 | Suenaga | |
| 2005/0077535 A1 | 4/2005 | Li | |
| 2005/0135105 A1 | 6/2005 | Teixeira et al. | |
| 2005/0152127 A1 | 7/2005 | Kamiya et al. | |
| 2005/0179376 A1 | 8/2005 | Fung et al. | |
| 2006/0049477 A1 | 3/2006 | Arndt | |
| 2006/0102917 A1 | 5/2006 | Oyama et al. | |
| 2006/0108594 A1 | 5/2006 | Iwasaki et al. | |
| 2006/0220046 A1 | 10/2006 | Yu et al. | |
| 2007/0269586 A1 | 11/2007 | Leatherdale | |
| 2008/0048193 A1* | 2/2008 | Yoo | H01L 25/0753 257/89 |
| 2008/0074032 A1 | 3/2008 | Yano et al. | |
| 2008/0308825 A1* | 12/2008 | Chakraborty | H01L 33/56 257/98 |
| 2009/0050911 A1 | 2/2009 | Chakraborty | |
| 2009/0057699 A1 | 3/2009 | Basin | |
| 2009/0129073 A1 | 5/2009 | Yaw et al. | |

FOREIGN PATENT DOCUMENTS

| | | |
|---|---|---|
| CN | 1581527 A | 2/2005 |
| CN | 1591924 A | 3/2005 |
| CN | 1679168 A | 10/2005 |
| CN | 1744335 A | 3/2006 |
| CN | 1812148 | 8/2006 |
| CN | 2809880 | 8/2006 |
| CN | 2809880 Y | 8/2006 |
| CN | 200956374 Y | 10/2007 |
| CN | 101958390 A | 1/2011 |
| EP | 1005085 A2 | 5/2000 |
| EP | 1187228 | 3/2002 |
| EP | 1521313 | 4/2005 |
| EP | 1686630 A2 | 8/2006 |
| JP | 03-171780 | 7/1991 |
| JP | 05121785 | 5/1993 |
| JP | 05079586 | 10/1993 |
| JP | 06-177424 | 6/1994 |
| JP | 06177424 | 6/1994 |
| JP | A 06177424 | 6/1994 |
| JP | 8139257 | 5/1996 |
| JP | 11161196 | 6/1999 |
| JP | H11154766 | 6/1999 |
| JP | 200012894 | 1/2000 |
| JP | 2000012894 | 1/2000 |
| JP | 2000223752 | 8/2000 |
| JP | 2001068739 | 3/2001 |
| JP | 2005285874 | 10/2005 |
| JP | 2005285899 A | 10/2005 |
| JP | 2006-324331 | 11/2006 |
| JP | 2007-273763 | 10/2007 |
| JP | 2007-287981 | 11/2007 |
| JP | 2007-299905 | 11/2007 |
| JP | 2008103300 | 5/2008 |
| JP | 2008188789 | 7/2008 |
| JP | 2008191641 | 8/2008 |
| JP | 2010026863 | 2/2010 |
| KR | 20020057323 | 7/2002 |
| WO | WO 0217405 | 2/2002 |
| WO | WO 04044877 | 5/2004 |
| WO | WO 05043627 A1 | 5/2005 |
| WO | WO 05104247 | 11/2005 |
| WO | WO 06054228 A2 | 5/2006 |
| WO | WO 06054228 A3 | 5/2006 |
| WO | WO 2006111805 | 10/2006 |
| WO | WO 2007/083408 A1 | 7/2007 |
| WO | WO 2007083408 | 7/2007 |
| WO | WO 2009/074919 A1 | 6/2009 |

OTHER PUBLICATIONS

International Search Report and Written Opinion from counterpart application PCT/CN2010/001009 dated Oct. 21, 2010.
International Search Report and Written Opinion from PCT/US2010/001852 dated Nov. 11, 2010.
From Related Chinese Application): Chinese Application No. 200710142310.7 dated Dec. 11, 2009.
From Related Application: International Search Report for PCT/CN2009/074800 dated Feb. 25, 2010.
International Search Report and Written Opinion.
Related U.S. Appl. No. 11/656,759, Wafer Level Phosphor Coating Method and Devices Fabricated Utilizing Method, filed Jan. 22, 2007.
Related U.S. Appl. No. 11/899,790, Wafer Level Phosphor Coating Method and Devices Fabricated Utilizing Method, filed Sep. 7, 2007.
Related U.S. Appl. No. 11/473,089, "Close Loop Electrophoretic Deposition of Semiconductor Devices", filed Jun. 21, 2006.
JP 2001 060072A , Abstract, Matsushita Electric Ind. Co Ltd., Mar. 6, 2001.
Preliminary Notice of Reasons for Refusal re related Japanese Application No. 2009-002857, dated Apr. 24, 2009, pp. 1-2.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-002857, dated Jul. 24, 2009.
Office Action from related China Application No. 200710142310.7, dated Dec. 11, 2009.
First Office Action for Chinese Patent Application No. 200780019643.9 dated Mar. 29, 2010.
Appeal Decision in Japanese Design Patent Application No. 2009-002857 (Appeal No. 2010-002154) mailed Aug. 20, 2010.

(56) References Cited

OTHER PUBLICATIONS

Office Action from U.S. Appl. No. 12/657,935, dated Mar. 28, 2012.
Notification of Transmittal of International Preliminary Report on Patentability; International Preliminary Report on Patentability for counterpart PCT Patent Application No. PCT/CN2010/001009 dated Oct. 13, 2011.
First Office Action from Chinese Patent Appl. No. 201080001659.9, dated Jun. 9, 2013.
Office Action from Japanese Patent Appl. No. 2012-518730, dated Nov. 22, 2013.
Office Action from Japanese Patent application No. 2012-518730, dated Jun. 7, 2013.
International Preliminary Report on Patentability from PCT Application No. PCT/CN2010/001854, dated Aug. 9, 2012.
Search Report from Chinese Patent Appl. No. 201080001659.9, dated Dec. 26, 2013.
Second Office Action from Chinese Patent Appl. No. 201080001659.9, dated Jan. 9, 2014.
Decision of Grant for Japanese Patent Appl. No. 2012-518730, dated Mar. 26, 2014.
First Office Action from Chinese Patent Appl. No. 201010624281X, dated Jul. 31, 2014.
Third Office Action from Chinese Patent Appl. No. 2010800016599, dated Sep. 1, 2014.
Extended European Search Report from European Patent Appl. No. 10796654.1-1903/2452330, dated Sep. 30, 2014.
Office Action and Search Report from Taiwanese Patent Appl. No. 099122184, dated Aug. 14, 2014.
Communication from European Patent Appl. No. 10796654.1-1903, dated Oct. 17, 2014.
Notification of the Fourth Office Action from Chinese Patent Appl. No. 2010800016599, dated Feb. 25, 2015.
Notice of Allowance from Taiwanese Patent Appl. No. 099122184, dated Apr. 10, 2015.
Notification of the Second Office Action from Chinese Patent Appl. No. 20101062, dated Feb. 28, 2015.
Third Office Action from Chinese Patent Appl. No. 201010624281X, dated Aug. 4, 2015.
Notice of Issuance for Application No. 20100624281; dated Feb. 16, 2016.
Fifth Office Action from Chinese Patent Appl. No. 2010800016599, dated Nov. 3, 2015.
Foreign Office Action for Chinese Application No. 2010800016599; dated Jul. 4, 2017.
Foreign Office Action for Chinese Application No. 2010800016599, dated Dec. 20, 2016.
Notification of Reason for Refusal for Korean Patent Application No. 10-2012-7003258, dated Mar. 10, 2017, 10 pages.
Non-Final Office Action for U.S. Appl. No. 13/161,263, dated Dec. 14, 2012, 12 pages.
Notice of Allowance for U.S. Appl. No. 13/161,263, dated Apr. 1, 2013, 9 pages.
PCT International Search Report and Written Opinion for PCT/CN2011/000604, dated Jan. 19, 2012, 9 pages.

\* cited by examiner

V-V PEAK SHIFT ~8 DEG

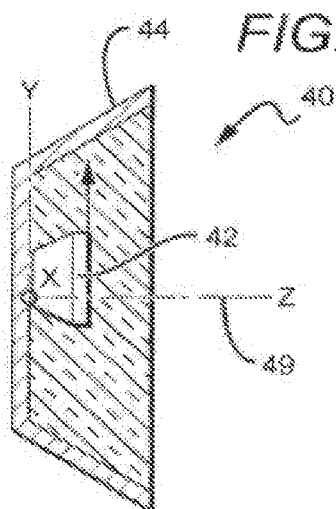
FIG. 5
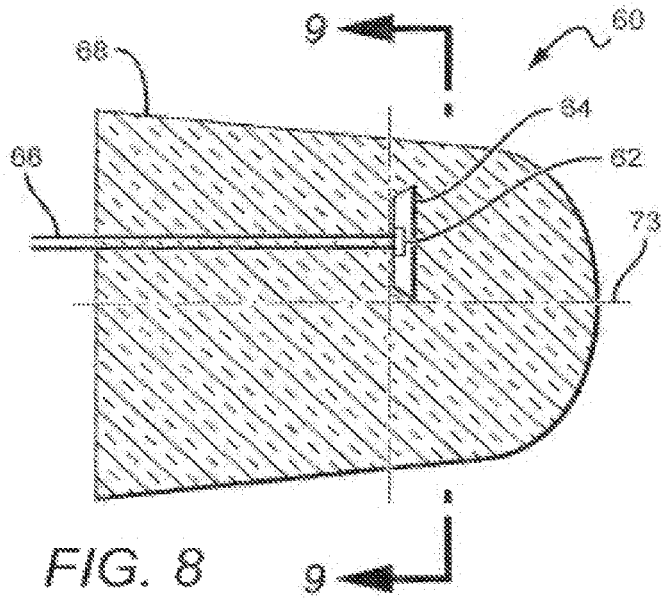
FIG. 8
FIG. 6
| ITEM | DATA | | | | | |
|---|---|---|---|---|---|---|
| DICE SHIFT (mm) | 0 | 0.01 | 0.02 | 0.03 | 0.04 | 0.05 |
| PEAK SHIFT (deg) | 0 | 0.5 | 0.9 | 1.4 | 2.3 | 7.7 |
| H-H (deg) | 102.6 | 99.9 | 99.9 | 99.9 | 99.5 | 82.1 |
| V-V (deg) | 34.2 | 31.5 | 31.5 | 32 | 32 | 33.8 |
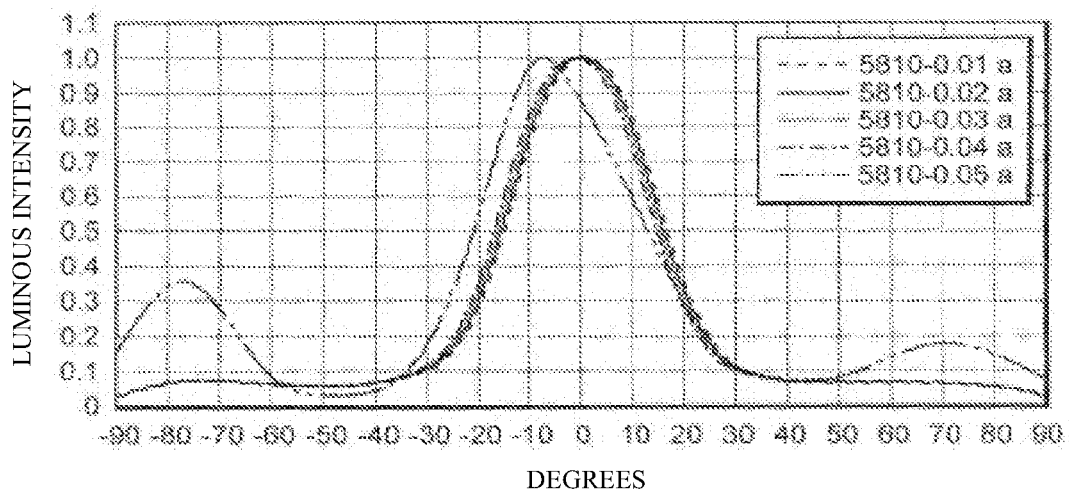
FIG. 7

FIG. 13
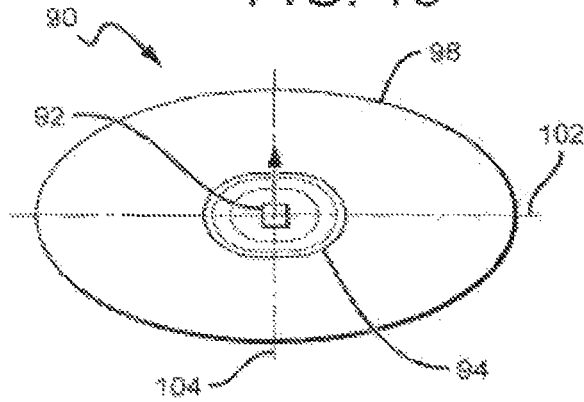
FIG. 14
| ITEM | DATA | | | | |
|---|---|---|---|---|---|
| ROTATION DEGREE | 0 | 3 | 5 | 10 | 15 |
| PEAK SHIFT (deg) | 0 | 3.2 | 5 | 9.8 | 13.5 |
| H-H (deg) | 102.6 | 101.7 | 104 | 107.6 | 99.9 |
| V-V (deg) | 34.2 | 31.5 | 32 | 32.4 | 32.4 |
FIG. 15
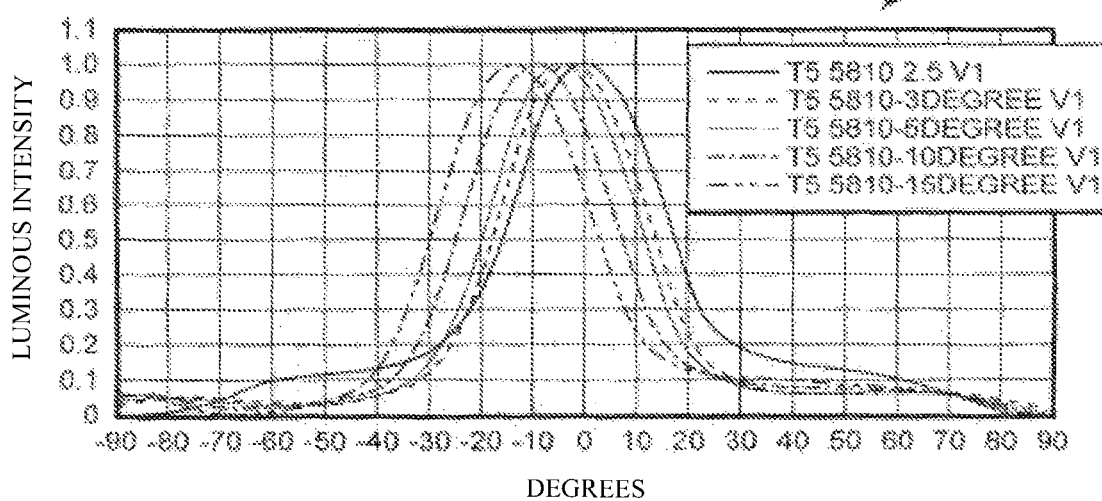

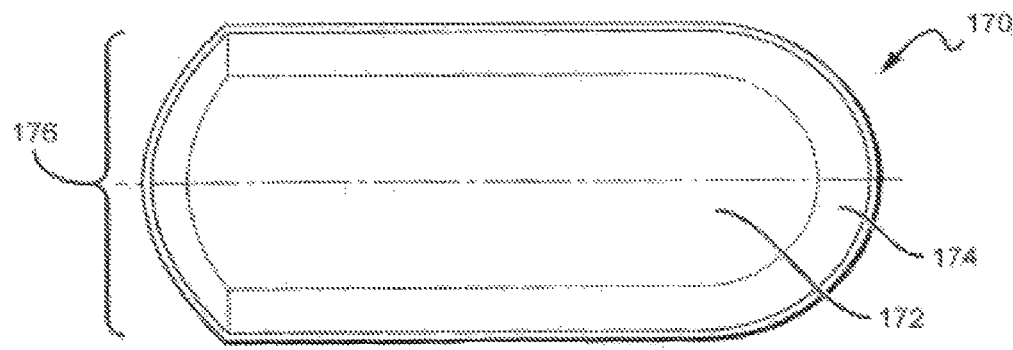
FIG. 19
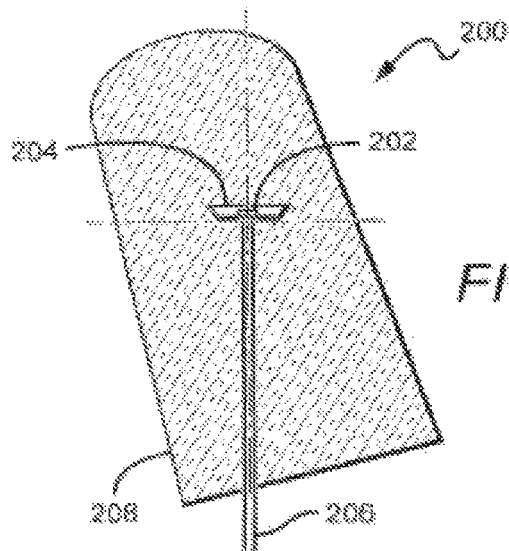
FIG. 22
FIG. 23
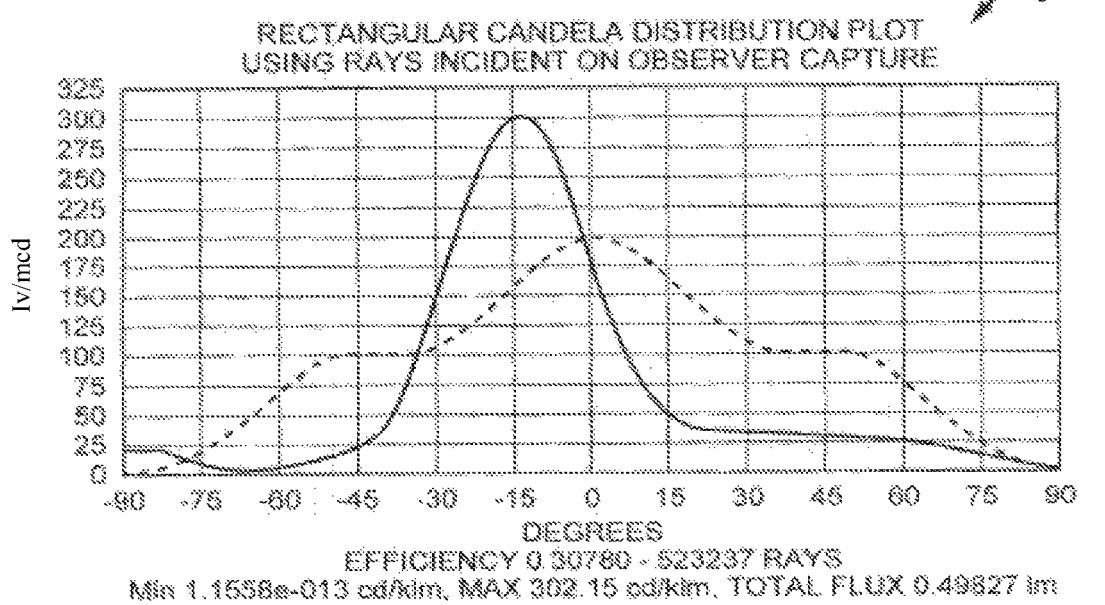

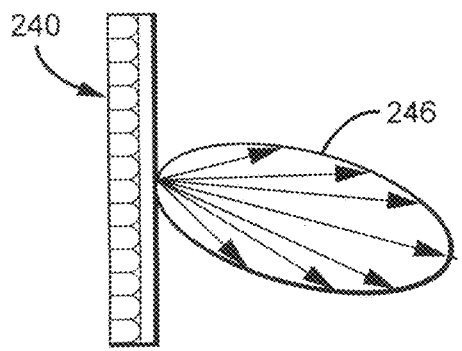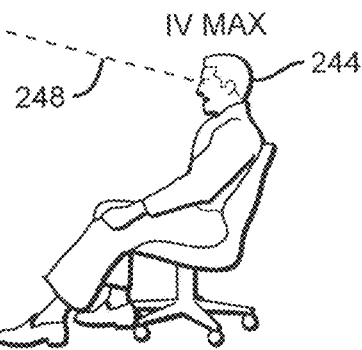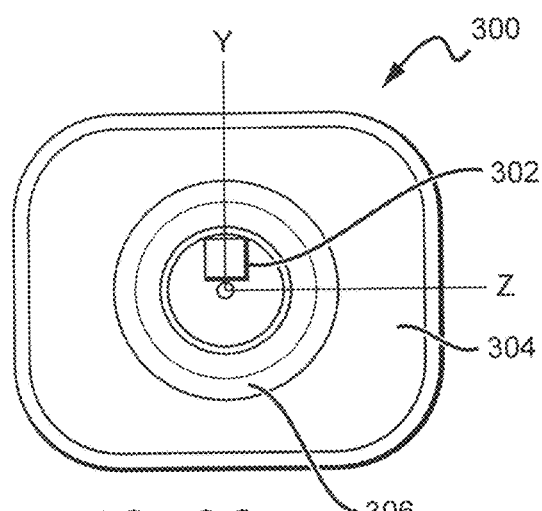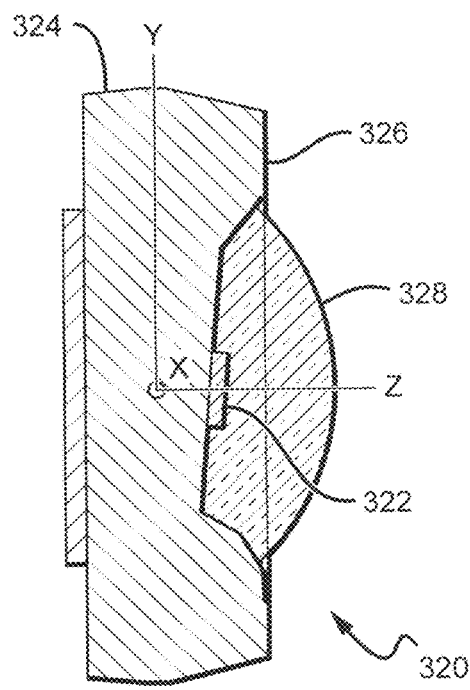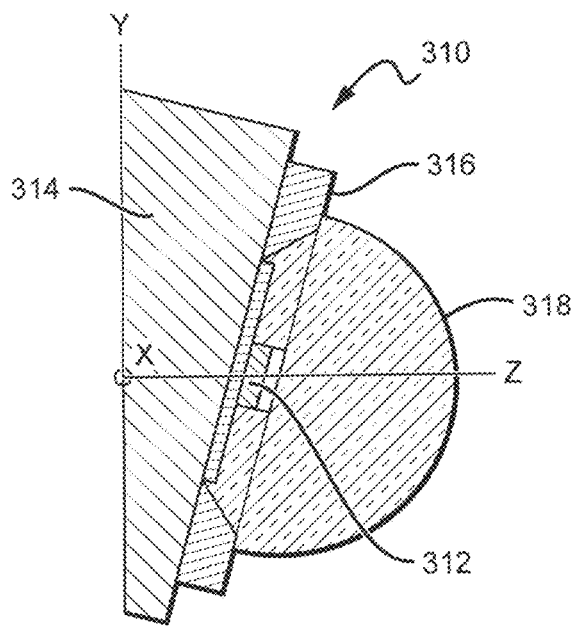
FIG. 25
FIG. 26
FIG. 27
FIG. 28

LIGHT EMITTING DIODE DISPLAY WITH TILTED PEAK EMISSION PATTERN

BACKGROUND OF THE INVENTION

1. Field of the Invention

This invention relates to light emitting diodes (LED or LEDs) and in particular displays utilizing LEDs.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other lights sources and can consume less power. For these and other reasons, LEDs are becoming more popular and are now being used in more and more applications that have traditionally been the realm of incandescent, fluorescent, halogen and other emitters.

LEDs are also being used in displays, both big and small. Large screen LED based displays (often referred to as giant screens) are becoming more common in many indoor and outdoor locations, such as at sporting events, race tracks, concerts and in large public areas such as Times Square in New York City. Many of these displays or screens can be as large as 60 feet tall and 60 feet wide. These screens can comprise thousands of "pixels" or "pixel modules", each of which can contain a plurality of LEDs. The pixel modules can use high efficiency and high brightness LEDs that allow the displays to be visible from relatively far away, even in the daytime when subject to sunlight. The pixel modules can have as few as three or four LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. For example, a grid can be 640 modules wide and 480 modules high, with the end size of the screen being dependent upon the actual size of the pixel modules.

Conventional LED based displays are controlled by a computer system that accepts an incoming signal (e.g. TV signal) and based on the particular color needed at the pixel module to form the overall display image, the computer system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

LED displays are rarely mounted at the viewer's eye level, and are more typically mounted at an elevation above eye level, such as on the side of building or the top of the grandstands in a stadium. Referring now to FIGS. 1 and 2, a conventional LED display 10 is shown mounted at an elevated point above the eye level of the viewer 12. The viewer 12 is typically positioned below the display 10 and looks up to the display such that the viewer's line of sight 14 to the display 10 is at an angle θ to the display's emission direction 16 perpendicular to the display surface. Referring now to FIG. 2, the LED display as shown in FIG. 1 typically comprises a plurality emitters such as the LED package 20, which generally comprising a LED 22, mounted in a reflective cup 24, that is encased in a generally bullet shaped encapsulant 26. The peak emission for the LED package 20 is typically along the packages longitudinal axis 28. FIG. 3 is a polar iso-candelar graph 30 for the LED packages 20, showing the typical peak emission for being along the emitter's longitudinal axis.

Referring again to FIG. 1, having a display comprising a plurality of LED packages 20 emitting with characteristics shown in the graph 30 results in display peak emission characteristic perpendicular in the perpendicular direction 16, as shown. The Iv and far field pattern (FFP) peak emission characteristics for the LED display 10 is also perpendicular to the display along the perpendicular axis 16. The viewer's line of sight 14 is below perpendicular when the display 10 is mounted at an elevated point, much of the light emitted by the display is not seen by the viewer and is wasted. One way to reduce the amount of light that is wasted is by mounting the display at an angle to better match the viewer's line of sight 14, but this can require complex and expensive mounting hardware that is difficult to use, particularly for very large displays mounted at high elevations.

SUMMARY OF THE INVENTION

The present invention is directed to LED packages and LED displays utilizing the LED packages, where the peak emission of the LED is tilted or shifted to customize its peak emission to match the mounting height or location of the LED display. One embodiment of an LED display according to the present invention comprises a plurality of LED packages where the peak emission from at least some of the LED packages is tilted off the package centerline. The LED packages are mounted within the display in such a way as to generate an image having a peak emission that is tilted off the perpendicular to the plane of the display. Many different types and arrangements of LED package embodiments are disclosed that can be used in LED displays according to the present invention. It is understood that many other embodiments can also be used.

One embodiment of an LED package comprises an LED within a reflective cup, with the LED shifted off the center of the reflective cup. Another embodiment comprises an LED mounted within a reflective cup and an encapsulant covering at least part of the reflective cup. The reflective cup can be shifted off the perpendicular centerline of the LED package. Another embodiment of an LED package comprises an LED mounted within a reflective cup and an encapsulant covering at least part of the reflective cup. The reflective cup can be shifted off the centerline of the encapsulant.

Other embodiments of an LED package can comprise an LED mounted within a reflective cup and an encapsulant covering at least part of said reflective cup, with the reflective cup rotated within the encapsulant. Still other embodiments can comprise reflective cups or encapsulants that are asymmetric. The LED packages can also comprise an LED mounted within a reflective cup, a wire lead frame and an encapsulant surrounding the reflective cup and at least part of said wire lead frame. In these embodiments the encapsulant can be rotated about the reflective cup and lead frame.

These and other aspects and advantages of the invention will become apparent from the following detailed description and the accompanying drawings which illustrate by way of example the features of the invention.

BRIEF DESCRIPTION OF THE DRAWINGS

FIG. 5 is a sectional view the LED package shown in FIG. 4 taken along section lines 5-5;

FIG. 6 is a table showing the shift in peak emission for an LED package by shifts of the LED in the reflector cup;

FIG. 7 is a rectangular candela distribution plot showing the shift in peak emission for an LED package by shifts of the LED in the reflector cup;

FIG. 8 is side view of another embodiment of an LED package according to the present invention;

FIG. 13 is section view of the LED package in FIG. 12 taken along section lines 13-13;

FIG. 14 is a table showing the shift in peak emission for an LED package by rotation degree of a reflector cup;

FIG. 15 is a rectangular candela distribution plot showing the shift in peak emission pattern by rotation degree of reflector cup;

FIG. 19 is a top view of another embodiment of a reflective cup that can be used in LED packages according to the present invention;

FIG. 22 is a side view of another embodiment of an LED package according to the present invention;

FIG. 23 is a rectangular candela distribution plot showing the shift in peak emission pattern by rotation of the encapsulant in an emitter package according to the present invention;

FIG. 25 is a schematic showing an LED display utilizing LED packages according to the present invention;

FIG. 26 is a top view of a surface mount LED package according to the present invention;

FIG. 27 is a side view of another embodiment of a surface mount LED package according to the present invention;

FIG. 28 is a side view of another embodiment of a surface mount LED package according to the present invention;

FIG. 33 is a sectional view of another embodiment of a surface mount LED package according to the present invention;

DETAILED DESCRIPTION OF THE INVENTION

Figure 1:
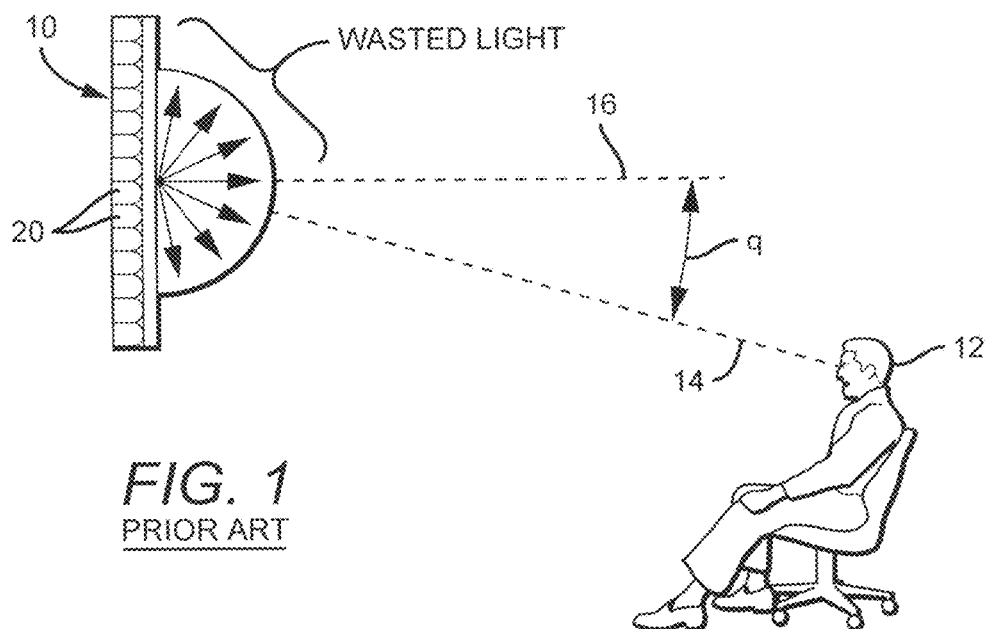
FIG. 1 is a schematic of a conventional LED display mounted above a viewer.
Figure 2:
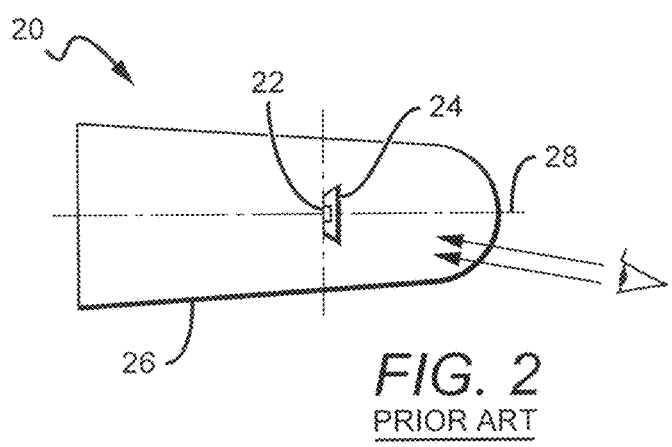
FIG. 2 is a side view of an LED package that could be used in the LED display in FIG. 1.

The present invention is directed to various embodiments of LEDs packages characterized by having the peak Iv and FFP emission characteristics shifted or tilted at an angle from the perpendicular centerline to the LED displays utilizing the LED packages. The LED displays according to the invention can use LED packages as their emitters, and by arranging the LED packages with a substantially similar shift or tilt in peak emission, the LED displays can provide peak emission having the same or similar shift or tilt.

In the some embodiments, the tilt in the emission shift of the LED displays is described in relation to the plane of the displays, and in particular in relation to a perpendicular to the plane of the displays. For flat displays, the plane of the display is the surface of the display and when the display is mounted to a flat surface this is typically parallel to the display's mounting surface. For curved displays, the plane is a tangent plane to the display surface and in some embodiments the tangent plane can be parallel to the display's mounting surface. In this embodiment, the perpendicular to the plane of the display (i.e. tangent plane) is also perpendicular to the mounting surface.

In some embodiments the peak emission characteristics of the LED packages and LED displays are tilted down in relation to the display plane perpendicular. This arrangement is particularly applicable to applications where the displays are mounted above eye level of the likely viewer. The peak emission characteristics of these LED displays more closely match the viewer's line of sight to the display. This increases the amount of useful light directed to the viewer, and reduces the amount of wasted light. This also allows for the display to be mounted flat in its elevated location, eliminating the cost and complications for mounting the display at an angle, while still allowing for more LED light to be directed along the viewer's line of sight. By having more of the light directed along the viewer's line of sight, the elevated display can appear brighter and with more vivid colors compared to displays having peak Iv and FFP characteristics that are perpendicular to the display.

Many different embodiments according to the present invention are described below that provide for the desired shift or tilt in peak emission, but it is understood that the tilt can be provided in different ways beyond those described herein. As mentioned, some of the embodiments are described with reference to titling the peak emission down, allowing elevated displays to be viewed more effectively by viewers below the display. It is understood, however, that the embodiments according to the present invention can also be used for shifting the peak emission up, or for shifting the peak emission left or right. Although the embodiments of the displays are described with reference to LEDs, it is also understood that many different types of emitters can be used. The LEDs can also have different mounting arrangements for mounting in the display, such a leads or surface mount arrangements.

Different shifts or tilts in the peak emission can be provided in different embodiments depending on different factors such as the size of the display, the height of the display, and the distance from the display for a typical viewer. A suitable range for the peak emission tilt is in the range of 5-20 degree tilt to best fit outdoor applications, although it is understood that other ranges of tilt angles can be used. This range of peak emission tilts would, for example, be suitable for a display that is 10 meters high with the viewer being 25-40 meters from display.

The present invention is described herein with reference to certain embodiments, but it is understood that the invention can be embodied in many different forms and should not be construed as limited to the embodiments set forth herein. In particular many different LED, reflective cup and lead frame arrangements can be provided beyond those described above, and the encapsulant can provide further features to alter the direction of peak emission from the LED packages and LED displays utilizing the LED packages. Although the different embodiments of LED packages discussed below are directed to use in LED displays, they can be used in many other applications either individually or with other LED packages having the same or different peak emission tilt.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
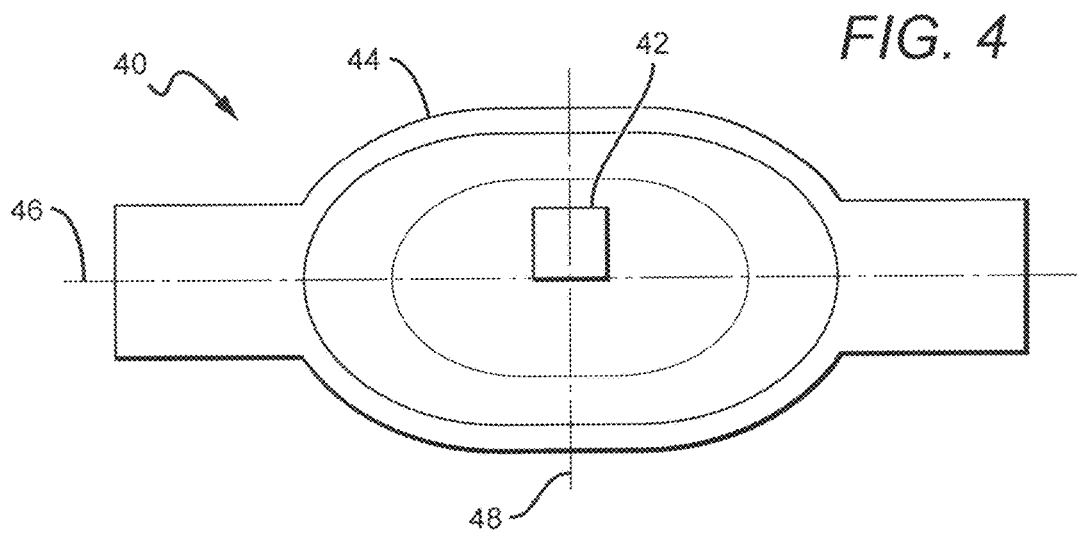
FIG. 4 is a top view of one embodiment of an LED package according to the present invention.
Figure 3:
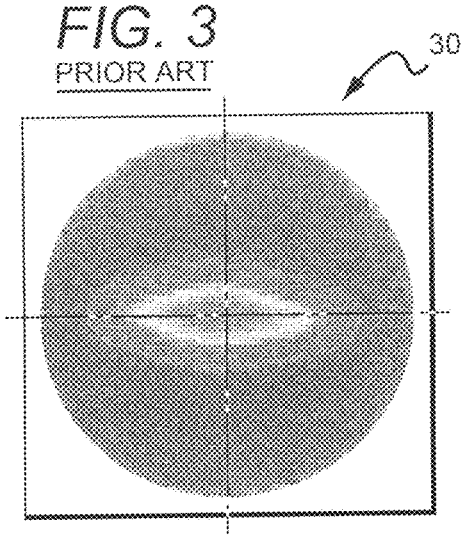
FIG. 3 is polar iso-candelar graph showing the light emission characteristics of the LED package in FIG. 2.

FIGS. 4 and 5 show one embodiment of an LED package 40 according to the present invention having a shifted or tilted peak emission. It is understood that each or most of the pixel modules in an LED display can have a plurality of LEDs similar to LED package 10, with each having a similar shift in its peak emission. The accumulation of this shift results in a tilt in image projected by the display.

The LED package 40 comprises an LED 42 mounted in the reflective cup 44 using known mounting methods, with the cup 44 having angled side surfaces to reflect side emitted light from the LED 42 in a direction to contribute to the desired emission from the LED package 40. Reflective cup 44 has a generally oval shape, but it is understood that it can have many different shapes and sizes. Wire bonds are included for applying an electrical signal to the LED 42, and the LED package 40 can be encased on a transparent material (not shown), such as an epoxy, that protects the LED, reflective cup and any electrical connections, and can shape the light emitting from the package 40.

Fabrication of conventional LEDs is generally known, and is only briefly discussed herein. LEDs can be fabricated using known processes with a suitable process being fabrication using metal organic chemical vapor deposition (MOCVD). The layers of the LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in LEDs 42, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on LEDs 42 with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

LEDs that emit red light can comprise LED structures and materials that permit emission of red light directly from the active region. Alternatively, in other embodiments the red emitting LEDs can comprise LEDs covered by a phosphor that absorbs the LED light and emits a red light. Some phosphors appropriate for this structures can comprise: $Lu_2O_3$: $Eu^{3+}$; $(Sr_{2-x}La_x)$ $(Ce_{1-x}Eu_x)$ $O_4$; $Sr_{2-x}Eu_xCeO_4$; $SrTiO_3$:$Pr^{3+}$,$Ga^{3+}$; $CaAlSiN_3$: $Eu^{2+}$; and $Sr_2Si_5N_8$:$Eu^{2+}$.

LEDs that are coated can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", now U.S. Pat. No. 9,024,349 and U.S. Pat. No. 9,159,888, respectively, and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", now U.S. Pat. No. 8,563,339, which is also incorporated herein by reference. It is understood that LED packages according to the present invention can also have multiple LEDs of different colors, one or more of which may be white emitting.

The submounts described herein can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polymide and polyester etc. In one embodiment, the dielectric material has a high thermal conductivity such as with aluminum nitride and silicon carbide. In other embodiments the submounts can comprise highly reflective material, such as reflective ceramic or metal layers like silver, to enhance light extraction from the component. In other embodiments the submount 42 can comprise a printed circuit board (PCB), alumina, sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

Referring again to FIGS. 4 and 5, in conventional LED packages the LED is mounted at or near the center of the cup's bottom surface. The peak emission from the typical LED packages is generally along the package centerline package centerline 49, which is a path perpendicular from the reflective 44 out the end or top of the encapsulant. The center of the reflective cup's bottom surface is shown where the horizontal mid-line 46 and the vertical mid-line 48 meet. In conventional LED packages, the LED chip is mounted as close as possible to a position where half of the LED footprint is above the horizontal mid-line 46 and half is below it. Similarly, for the vertical mid-line 48 the LED 42 is mounted as close as possible to a position where half of the LED footprint is on one side of the vertical mid-line 48 and half is on the other side. For LED package 40, however, the LED 42 is shifted off the center point at the bottom of the reflective cup 44, with the shift causing an opposite shift in the peak emission characteristics. In the embodiment shown the LED 42 is shifted up in the reflective cup 44 such that the majority or all of the LED 42 is above the horizontal mid-line 46. This causes a shift down in the peak emission characteristics.

Referring now to FIG. 6, table 50 shows a sampling of different distances of LED shift up in the reflector cup and the corresponding shift or tilt in peak emission as well as the changes in the vertical viewing angle (V-V) and the horizontal viewing angle (H-H). A conventional sized LED and reflector cup were used for these measurements, although it is understood that a package having LEDs or reflector cups with different sizes could experience different tilts in peak emissions for the same shift distances. For shifts as small as 0.01 millimeters (mm) the emission pattern experiences a 0.5 degree shift. At a shift up for the LED of 0.05 mm the shift in the peak emission is 7.7 degrees. This shift can be caused by a number of factors, one of which is the change to the asymmetrical field pattern with the shift of the LED. The shift of the LED beyond 0.05 mm can increase the peak tilt even further, but it is understood that a point is typically reached depending on the size of the reflector cup and encapsulant, where the changes in the tilt reduce with further shifts of the LED.

As further shown in FIG. 6, as the shift up increases, the vertical viewing angle V-V experiences minimal variations. The horizontal viewing angle H-H also experiences minimal variation as the shift up increases, until the shift reaches approximately 0.05 mm at which point the viewing angle can decrease. The point at which the horizontal viewing angle decreases can depend on different factors, such as the size of the LED in relation to the reflector cup size. FIG. 7 is a rectangular candela distribution plot 55 showing the 7.7 degree shift in the peak emission for a die shift of 0.05 mm.

It is understood that the LED can be shifted in other directions to cause shifts of the peak emission in other directions. For example, a shift of the LED down below the horizontal mid-line can cause a shift up in the peak emission, while a shift left or right can cause a peak emission to shift right and left, respectively. As mentioned above, a typical display can include hundreds or thousands of LEDs and if each LED exhibits a similar shift or tilt in peak emission, the image emitting from the display will experience a corresponding shift.

Figure 9:
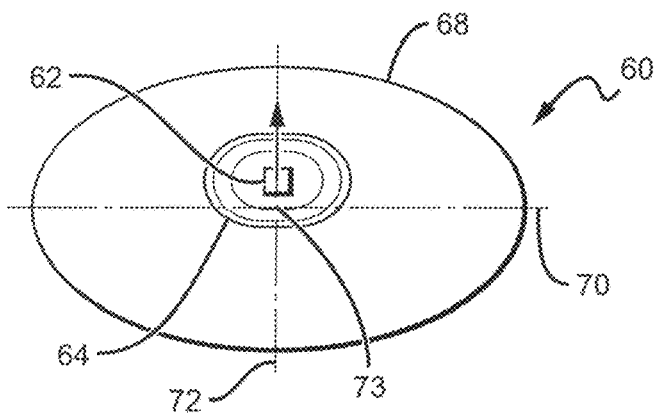
FIG. 9 is sectional view of, the LED package in FIG. 8 taken along section lines 9-9.

As mentioned above, this LED package peak emission shift or tilt can also be realized by other package arrangements. Conventional LED packages are often provided with the LED, reflective cup, and at least some of the wire bonds encapsulated in transparent material to provide protection and/or for beam shaping. FIGS. 8 and 9 show another embodiment of an LED package 60 according to the present invention comprising an LED 62, reflective cup 64 and wire lead frame 66 for applying an electrical signal to the LED 62. An encapsulant 68 surrounds the LED, reflective cup and most of the wire bonds and is generally bullet-shaped. The encapsulant 68 can be shaped to enhance light extraction from the chips and also protect the chip and related contacts structure (e.g. wire bonds) from exposure to physical damage or environmental conditions which could lead to corrosion or degradation. The end emission portion of the encapsulant 68 can have a generally hemispherical lens shape that can enhance light extraction from the package and in some instances, and can provide output light beam shaping.

As best shown in FIG. 9, the encapsulant 68 has a horizontal mid-line 70 and a vertical mid-line 72, with the encapsulant centerline 73 being along the longitudinal axis of the encapsulant. In conventional LED packages the reflective cup is mounted in the encapsulant 68 as close as possible to where the horizontal and vertical mid-lines meet, i.e. the middle of the encapsulant. In LED package 60, the reflective cup 64 is shifted off of the middle of the encapsulant, and in the embodiment shown is shifted up such that all or most of the reflective cup 64 is above the horizontal mid-line 70. This can result in shifting of the LED 62 and wire lead frame (not shown) with the reflective cup 64. This shift up causes a corresponding shift downward of the peak emission for the LED package 60.

Figure 10:
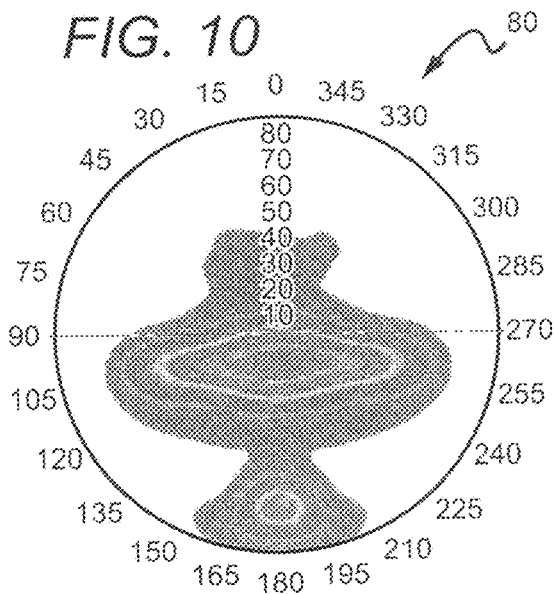
FIG. 10 is an polar iso-candela diagram showing the shift in emission pattern by shifting the reflective cup in an LED package.
Figure 11:
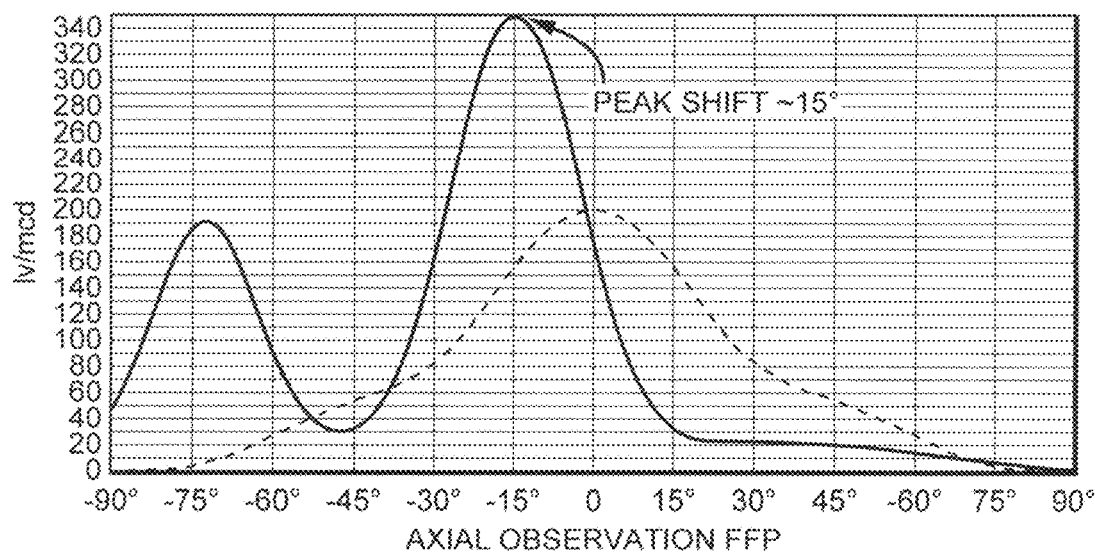
FIG. 11 is a rectangular candela distribution plot showing the shift in emission pattern by shifting the reflective cup in an LED package.

FIG. 10 comprises an iso-candela diagram 80 and FIG. 11 comprises rectangular candela distribution plot 85 for LED package 60 having a conventionally sized LED 62 mounted near the center of the conventionally sized reflective cup 64. This diagram shows the emission characteristics of the LED package 60 having a reflective cup 64 that is mounted 0.4 mm off-center of the encapsulant 68. This results in a corresponding shifting of the LED 62 and results in an approximately 15 degree shift in the peak emission. If the reflective cup 64 were mounted up in the encapsulant 68, the package 60 can experience a 15 shift or tilt down of its peak emission.

As with the embodiment above, this shift can be caused by a number of factors, with one being the asymmetrical field pattern produced by the package 60 resulting from the shift of the reflector cup 64. Further shifts of the reflective cup off the encapsulant centerline can cause additional shifts in peak emission, but a point may be reached where the peak emission shift is less significant, due to the restrictions of the reflective cup and the encapsulant. Also like the embodiment above, shifts of the reflective cup in different directions can cause different shifts or tilts in the peak emission, and a display image can be shifted or tilted by the display having most of its LED packages with the same shift or tilt.

Figure 12:
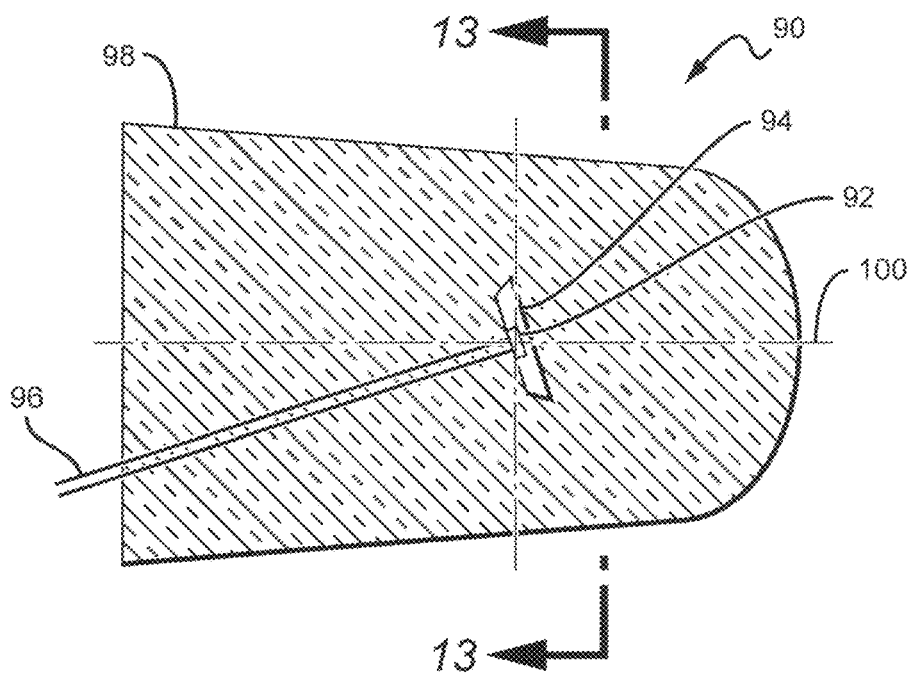
FIG. 12 is a side view of another embodiment of an LED package according to the present invention.

FIGS. 12 and 13 show another embodiment of LED package 90 that is similar to the LED package 60 in FIGS. 8 and 9, and comprising an LED 92, reflective cup 94, and a wire lead frame 96 for applying an electrical signal to the LED 92. A bullet shaped encapsulant 98 surrounds the LED 92, reflective cup 94 and most of the lead frame 96. As best shown in FIG. 13, in this embodiment the reflective cup 94 and its LED 92 are at or near the center or longitudinal axis 100 of the encapsulant, at or near the crossing point of the horizontal and vertical mid-lines 102, 104 (as best shown in FIG. 13). As best shown in FIG. 12, the reflective cup 94 and lead frame 96 are tilted within the encapsulant 98. That is, they are mounted at an angle off the longitudinal axis 100 of the package 90, which results in the primary emission of the LED 92 from its reflective cup 94 is also at an angle off the longitudinal axis in a amount generally corresponding the angle of tilt.

FIGS. 14 and 15 show the shift in peak emission with different rotation degrees for the LED package 90. FIG. 14 shows a table 110 with the output characteristics for the LED package 90 with a reflector cup and lead frame rotation of 0, 3, 5, 10 and 15 degrees. The 0 degree tilt the peak output emission is at 0 degrees, or along the longitudinal axis of the encapsulant. With each degree of reflective cup and lead frame tilt, the peak emission shifts. Also shown is the different vertical and horizontal viewing angle, V-V and H-H, respectively. FIG. 15 is a rectangular candela distribution plot 120 showing the peak emission waveforms for different rotations degrees of the reflective cup and lead frame. These waveforms correspond to the peak shift shown in table of FIG. 14.

Figure 16:
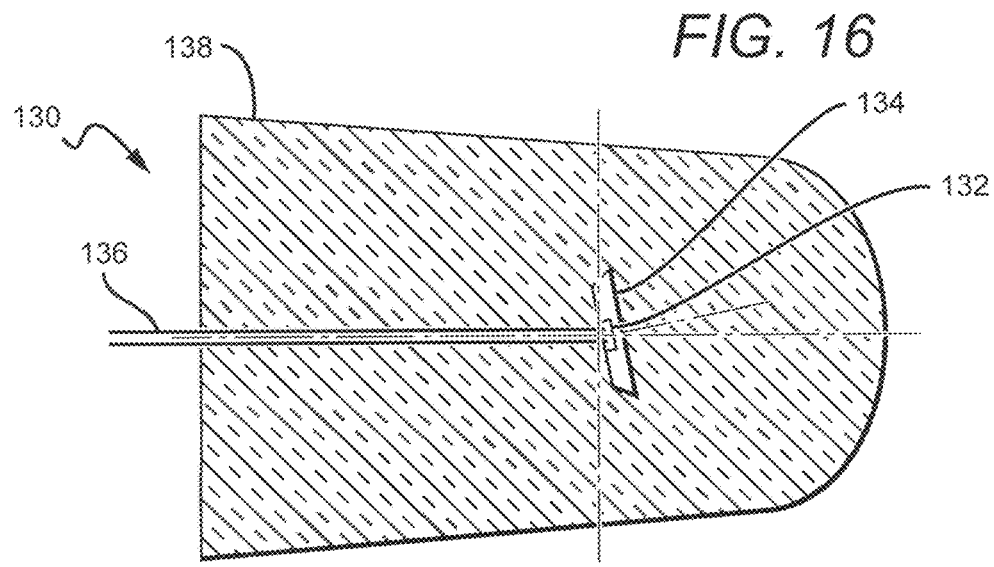
FIG. 16 is a side view of another embodiment of an LED package according to the present invention.

FIG. 16 shows another embodiment of an LED package 130 according to the present invention that is similar to the LED package 90 in FIGS. 12 and 13. The LED package 130 comprises an LED 132, reflective cup 134 and lead frame 136, all within an encapsulant 138. In this embodiment, however, the reflective cup 134 is tilted, but the lead frame 136 is not, and is instead is arranged along the encapsulant's longitudinal axis. The different tilt angles for the reflective cup 134 can result in substantially the same shift in peak output emissions as illustrated in FIGS. 14 and 15. It is understood that the LED, reflective cup and lead frame can be mounted in many different ways to provide the peak emission tilt according to the present invention.

Further rotation of the reflective cup in the LED package 16 can result in further tilt of the peak emission, with practical limitations being presented by the restriction of the encapsulant. Different sized encapsulants can have different restrictions to the shift. For example, in some embodiments the limitation of reflector cup rotation can be up to 90 degrees, with the preferred range being 10-30 degrees. An LED display having LEDs that have reflector cups rotated the same amount can provide a corresponding shifted or tilted display emission.

Figure 17:
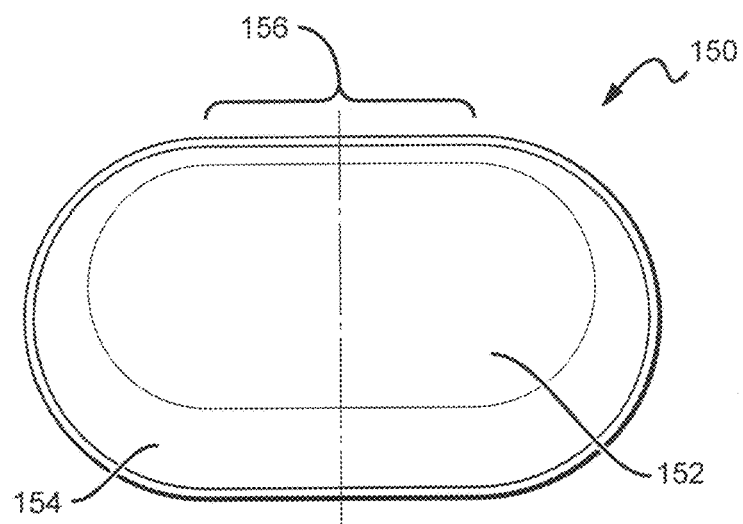
FIG. 17 is a top view of one embodiment of a reflector cup that can be used in LED packages according to the present invention.

A shift in the peak emission of LED packages according to the present invention can also be brought about by utilizing LED package features that are asymmetric. FIG. 17 shows one embodiment of an LED package reflective cup 150 according to the present invention that is asymmetric, and comprises a bottom surface 152 and an angled reflective surface 154. The reflective cup can be arranged in LED packages similar to those described above, with an LED mounted to the bottom surface 152 of the reflective cup 150. A wire lead frame and encapsulant can also be included as described above. The angled reflective surface 154 is arranged to reflect sideways emitted LED light so that it contributes to the desired emission direction for the LED package.

In conventional LED packages the reflective cup's angled reflective surface has approximately the same angle around the bottom surface. For reflective cup 150, however, the angled reflective surface 154 has an asymmetry presented by at least one section with a different angle compared to the remaining portions of the reflective surface. In the embodiment shown, the top section 156 has a different angle of reflection than the remaining of the angled surface 154 This causes the LED light that reflects from the top section 156 to be reflected at a different angle compared to the light reflecting from the remaining of the angled surface 154. Light reflects off the top section 156 at a steeper angle, which causes the peak emission to shift down, with the shift down being in a direction opposite from the top section 156. In other embodiments, the shift in peak emission can be toward the portion of asymmetry.

Figure 18:
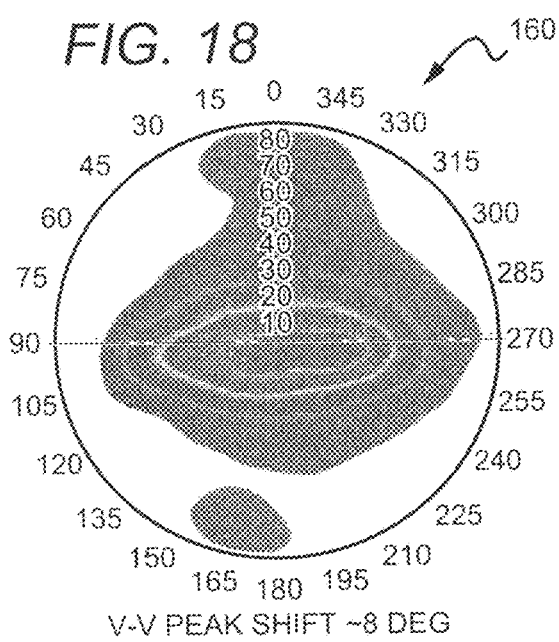
FIG. 18 is a polar iso-candela diagram showing the shift in peak emission pattern by using the reflective cup in FIG. 17 in an LED package according to the present invention.

FIG. 18 shows a polar iso-candela diagram 160 for a conventional LED package using the reflective cup 150 with an LED mounted near the center of the bottom surface 152. The LED package exhibits a peak emission shift or tilt down of approximately 8 degrees down for an emitter package using the reflective cup 150.

It is understood that different asymmetric features in the reflective cup can bring about different shifts in peak emission. FIG. 19 shows another embodiment of an LED package reflective cup 170 according to the present invention that is also asymmetric and comprises a bottom surface 172 and angled reflective surface 174. In this embodiment, the left portion 176 of the reflective surface 174 has a steeper angle than the remaining of the reflective surface. This can cause LED light to reflect from the left portion 176 at a steeper angle than the remaining of the reflective surface 174, which causes a right shift in peak emission. It is understood that different portions of the reflective surface 174 can have different angles, which in turn cause different shifts in the LED package peak emissions.

Figure 21:
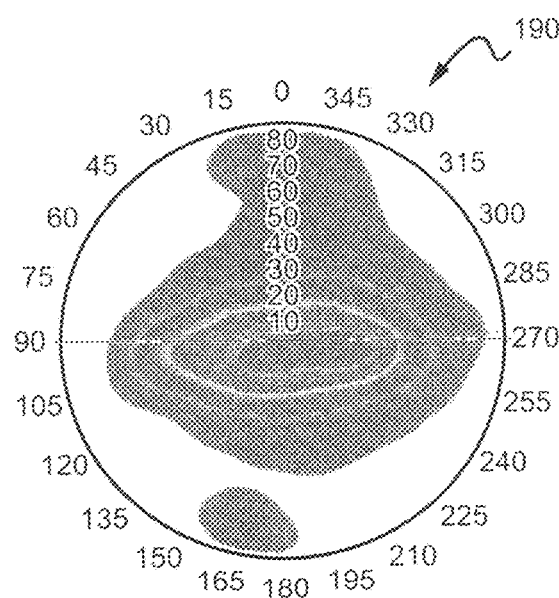
FIG. 21 is a polar iso-candela diagram showing the shift in peak emission pattern from an LED package with a asymmetric encapsulant as shown in FIG. 20.
Figure 20:
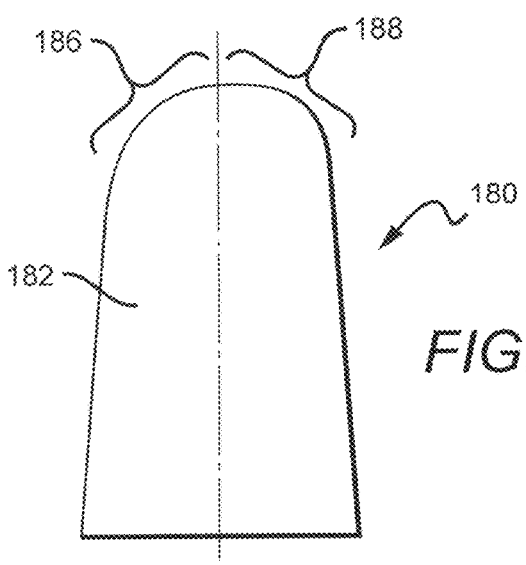
FIG. 20 is another embodiment of an LED package according to the present invention having an asymmetric encapsulant.

The encapsulant can also have an asymmetric shape to shift the peak emission. FIG. 20 shows an embodiment of an LED package 180 according to the present invention comprising encapsulant 182 with an internal reflective cup, LED in the reflective cup and lead frame (not shown). In the embodiment shown, the encapsulant has a first lens portion 186 and second lens portion 188, with the first lens portion 186 having a radius of curvature that is different from the second lens portion 188. The asymmetry in the lens portions 186, 188 results in a shift or tilt in peak emission from the package 180. This shift can be caused by different factors, such as light from the LED experiencing asymmetric reflection within the encapsulant. The asymmetric reflection causes a corresponding shift in peak emission. FIG. 21 is a polar iso-candela diagram 190 showing the shift in peak emission from the asymmetric lens, with the peak shifting approximately 8 degrees.

FIG. 22 shows still another embodiment of an LED package 200 according to the present invention comprising an LED 202 in a reflective cup 204, a lead frame 206, and a encapsulant 208. In this embodiment, the encapsulant 208 is formed such that it is rotated about the reflective cup 204, and lead frame 206. The LED package 200 can be mounted in a display in a conventional manner with the lead frame 206 orthogonal to the display, such that the LED encapsulant 208 is at an angle to orthogonal. The encapsulant 208 can be at many different angles according to the present invention, and in one embodiment the angle can be chosen to match the likely line of sight for viewers of the display. In one embodiment, the line of sight for viewers can be approximately 15 degrees from orthogonal to the display, and the rotation of the encapsulant 208 can be degrees off orthogonal to the display to match this likely line of sight.

Figure 24:
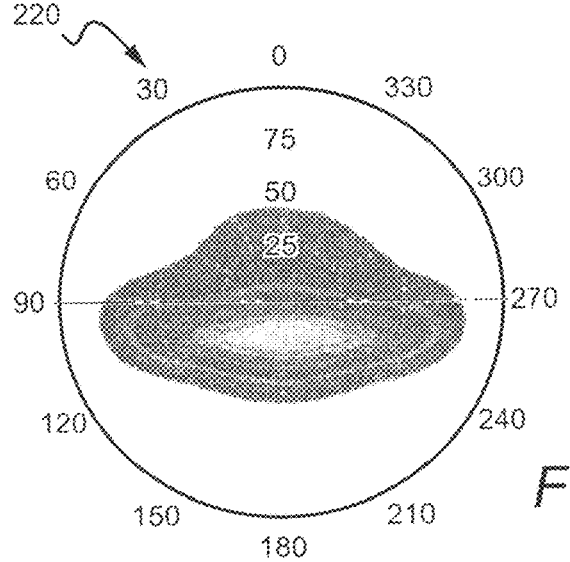
FIG. 24 is a polar iso-candela diagram showing the shift in peak emission pattern by rotation of the encapsulant in an emitter package according to the present invention.

FIG. 23 is a rectangular candela distribution plot 210 showing a shift in peak emission of approximately 15 degrees for an encapsulant rotation of approximately that same amount. FIG. 24 is a polar iso-candela graph 220 showing a similar shift in peak emission for a 15 degree rotation of the encapsulant. The shift can be caused by a number of factors, such as the lens light being reflected and emitted from the encapsulant orthogonally or asymmetrically, with the rotation of the encapsulant generally dictating the amount of orthogonal reflection and emission. Different shapes and sizes of encapsulants can result in different degrees of tilt in relation to the encapsulant rotation, and the shape and bulk of the encapsulant can present practical limitations to the amount of rotation.

It is understood that many other arrangements can be provided beyond those described above to provide shifted or tilted peak emission. One such arrangement could comprise mounting the LED packages at an angle in the display to provide the desired tilt in the LED display peak emission. Other embodiments can comprise combinations of the embodiment described above. For example, the reflective cup can be rotated along with rotation of the encapsulant. The LED could be shifted in the reflective cup along with the arrangements described in the other embodiments, such as asymmetric reflective cup, asymmetric encapsulant, reflective cup rotation, etc. These are only some of the many combinations that can be used to achieve the desired peak emission tilt.

As mentioned above, the LED packages embodiments according to the present invention can be used for many different applications, but are particularly applicable for use in LED displays to provide tilted peak emission patterns. FIG. 25 shows one embodiment of an LED display 240 that is mounted above a viewer 244, with the display 240 having a peak emission pattern 246 that more closely matches the viewing angle or line of sight 248 of the viewer 244.

As mentioned above, many different emitter types and packages can be used in the tilted displays according to the present invention. In some embodiments, surface mounted devices can be used, and FIG. 26 shows one embodiment of a conventional surface mount LED package 300 according to the present invention. It comprises an LED 302 mounted to a submount 304, with a reflector cup 306 mounted to the submount 304 to provide a reflective surface around the LED 302. The reflective cup 306 is typically arranged to reflect sideways emitted LED light. Electrical contact can be made to the LED through conductive traces on the submount or by wire bonds (not shown). An encapsulant (not shown) or lens is typically included over the LED. Similar to the shifted LED package 40 described above and shown in FIGS. 4 and 5, in package 300 the LED 302 is shifted up in the reflective cup 306, which in turn causes the peak emission to shift or tilt down. Also like the embodiment above, greater shifts in the LED can result in greater tilts in the peak emission, with practical limitations presented by restriction of the reflector cup.

FIG. 27 shows still another embodiment of a surface mount LED package 310 that can be used in displays to emit a shifted or tilted peak emission. The package 310 comprises LED 312 mounted to a submount 314 with a reflective cup 316 around the LED 312. The LED 312 can be covered by an encapsulant or lens 318 that is mounted to the reflective cup over the LED 312. In this embodiment, the submount 314 can have a wedge shape so that when it is mounted in the display it will be angled the desired amount to produce the shift of the peak emission from the display. Electrical contact can be made to the LED using conventional electrical traces on the submount or convention wire bonds.

FIG. 28 shows another surface mount LED package 320 that can be used in displays to emit a shifted or tilted peak emission, with the package also including an LED 322, submount 324 and reflector cup 326, with an encapsulant or lens 328 over the LED 322. In this embodiment, the LED 322 is mounted at an angle within the reflector cup 326. In this embodiment the LED 322 can sit in the base of the reflective cup 326, which is formed at an angle. This results in shifted peak emission from the LED package 320 resulting from the angle of the reflector base and the LED 322.

Figure 29:
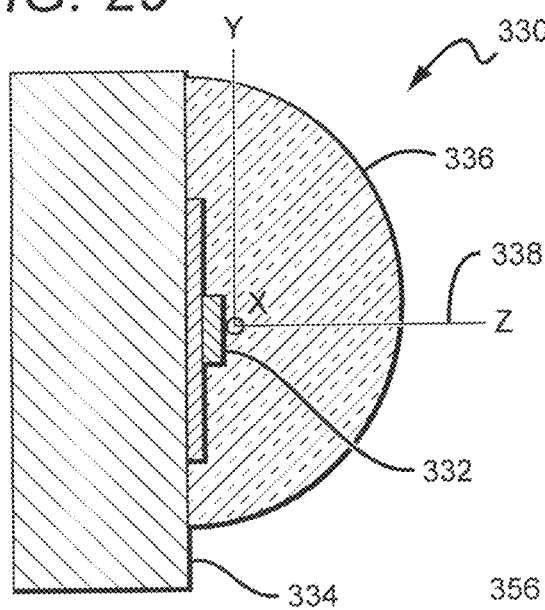
FIG. 29 is a side view of still another embodiment of a surface mount LED package according to the present invention.

FIG. 29 shows still another embodiment of a surface mount LED package 330 according to the present invention that is provided without a reflective cup. Instead, an LED 332 is mounted to a submount 334 with a dome shaped encapsulant or lens 336 over the LED. In this embodiment the LED is mounted on the centerline 338 of the submount 334, with the lens 336 shifted up from the centerline 338. This shift in the encapsulant causes a shift in the peak emission similar to the shift discussed above in reference to LED package 60 described above and shown in FIGS. 8 and 9. It is understood that other embodiments of surface mount LED packages can have reflective cups, with the cup and LED chip mounted around the LED package centerline and the lens shifted up from the centerline.

Figure 30:
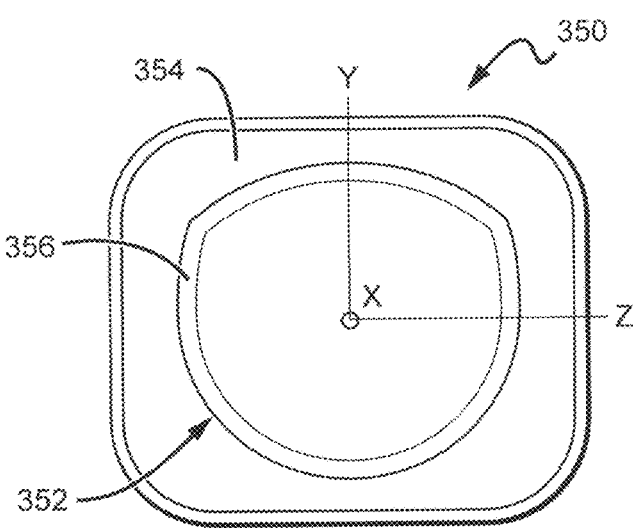
FIG. 30 is a top view of another embodiment of a surface mount LED package according to the present invention.
Figure 31:
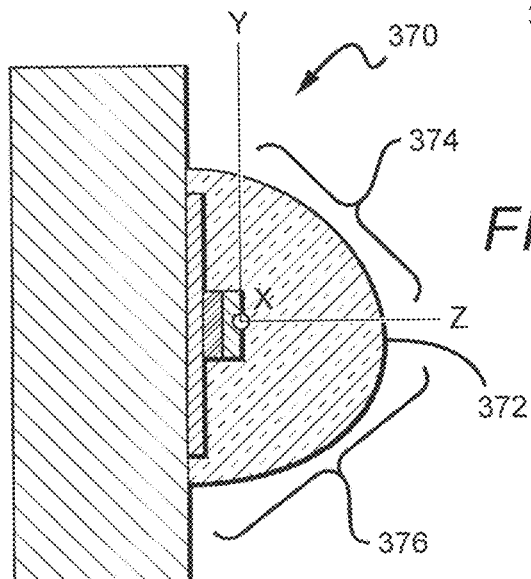
FIG. 31 is a side view of still another embodiment of a surface mount LED package according to the present invention.

As with the embodiments described above, the shift in LED package peak emission can also be realized by utilizing and asymmetric reflective cup, packaging or encapsulant. FIG. 30 shows one embodiment of a surface mount LED package 350 having a reflective cup 352 with a top reflective surface 354 having a different angle of reflection compared to the remaining reflective surface 356. This difference in reflective surfaces causes a corresponding shift down in peak emission from the LED package 350. FIG. 31 shows another embodiment of a surface mount LED package 370 according to the present invention having an asymmetric encapsulant or lens 372 with first and second lens portions 374, 376, with the first portion 374 having a different radius of curvature compared to the second portion. This asymmetry causes a shift in the peak emission from the LED package 370.

Figure 32:
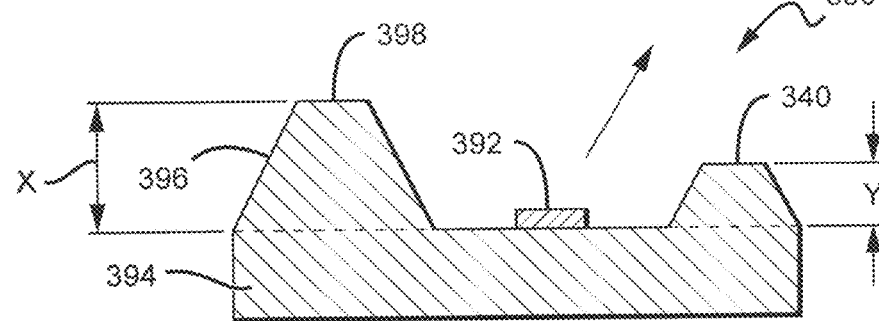
FIG. 32 is a sectional view of another embodiment of a surface mount LED package according to the present invention.

FIG. 32 shows another embodiment of a surface mount LED package 390 according to the present invention having an LED 392 mounted to the base of a reflective cup 394 having a reflective sidewall 396. In this embodiment, portions of the of the reflective cup sidewall 396 can have different heights, such as a first reflective cup sidewall portion 398 having a height x, and a second reflective cup portion 340 having a height y. In this embodiment, x is greater than y, which causes tilt in the peak emission from the LED package in the direction of the second reflective cup portion 340. It is understood that different variations in height of the reflective cup portions can result in different tilt angles for the peak emission, and that the reflective cup can have more than two sidewall portions with differing height. For example, in different embodiments the reflective cup can have three or more sidewall portions with differing heights.

FIG. 33 shows another embodiment of an LED package 410 according to the present invention also having an LED 412 mounted to the base of a reflective cup 414. In this embodiment the reflective cup 414 has a reflective cup sidewall 416 with portions having different reflective angles. A first reflective portion 418 has a reflective surface with an angle x° to the plane corresponding to the base of the reflective cup, and a second reflective portion 420 has a reflective surface with an angle y° also to plane corresponding to the base of the reflective cup 414. In this embodiment, x° is greater than y°, which causes a tilt in the direction of the second reflective portion 420. It is understood that different variations in reflective angles of the reflective cup portions can result in different tilt angles for the peak emission, and that the reflective cup can have more than two reflective portions with differing reflective angles. For example, in different embodiments the reflective cup can have three or more sidewall portions with differing reflective angles.

Figure 34:
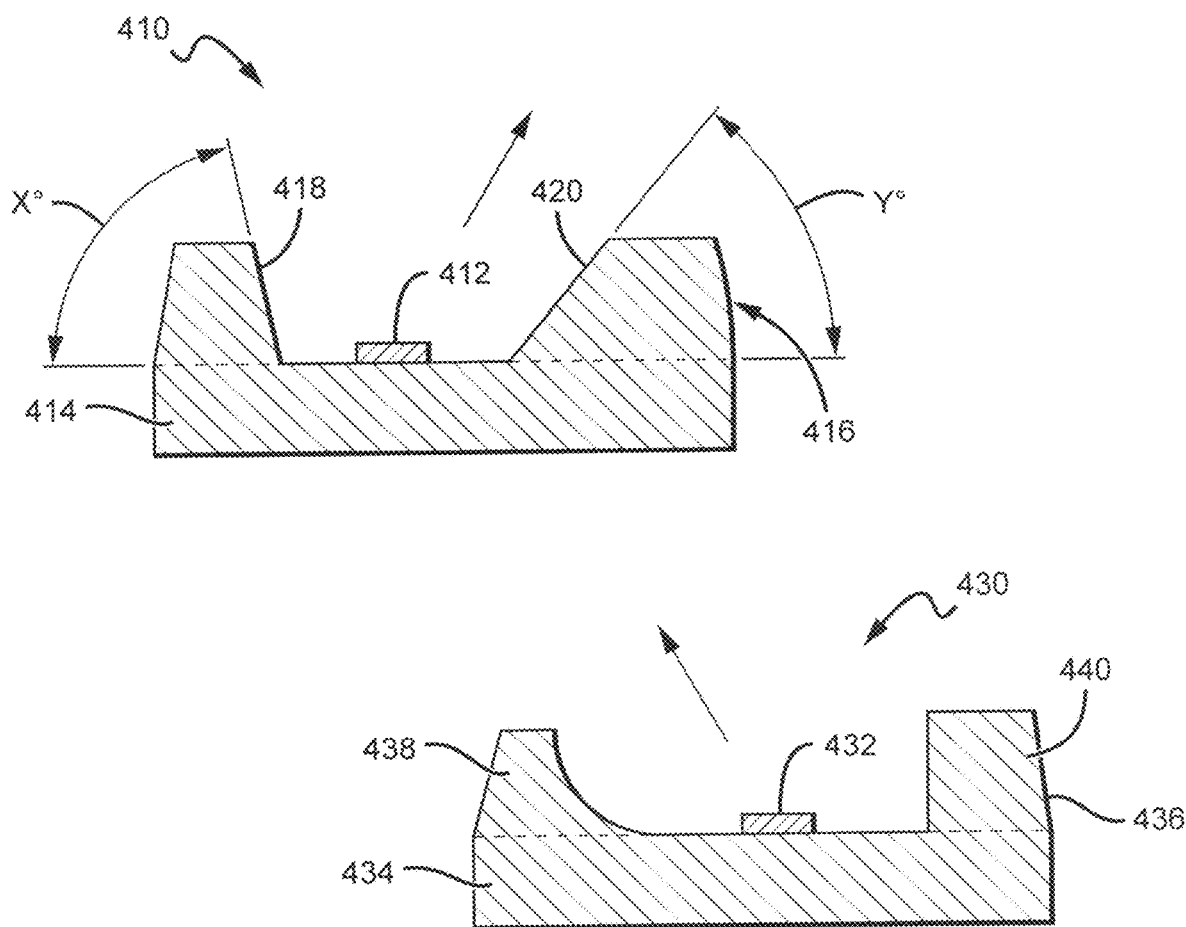
FIG. 34 is still another embodiment of a surface mount LED package according to the present invention.

FIG. 34 shows still another embodiment of an LED package 430 according to the present invention also having an LED 432 mounted to the base of a reflective cup 434. In this embodiment the reflective cup 434 has a reflective cup sidewall 436 with portions having different asymmetric shapes. In the embodiment shown, the reflective cup 434 can have a first reflective portion 438 with a curved reflective surface and a second reflective portion 440 with a vertical reflective surface. Depending on the desired tilt in peak emission angle, the reflective cup sidewall can have different portions with different asymmetries. In the embodiment shown the asymmetries result in a tilt of the peak emission in the direction of the first reflective portion 438. In different embodiments the reflective cup can have three or more sidewall portions with differing asymmetries to produce the desired peak emission tilt.

Figure 35:
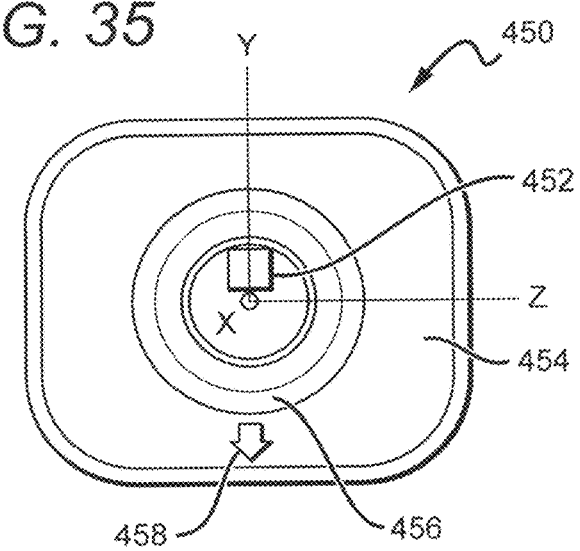
FIG. 35 is a top view of one embodiment of an LED package according to the present invention having a marker to designate direction of emission tilt.

FIG. 35 shows another embodiment of an LED package 450 according to the present invention that is similar to LED package 300 shown in FIG. 26. It comprises an LED 452 mounted to a submount 454, with a reflector cup 456 mounted to the submount 454 to provide a reflective surface around the LED 452. In this embodiment, a emission direction marker 458 is included on the submount showing the direction of emission tilt for the package 450. This marker assists in fabrication of LED displays utilizing LED packages 450 so that the direction of tilt is easily recognized. This provides for consistent and reliable placement of the desired orientation to provide the desired emission tilt of the display. It is understood that these markers can take many different forms and can be in many different locations on the packages, including but not limited to the reflective cups, encapsulants or the LEDs. What is important is that the markers communicate the direction of emission tilt for the particular LED package.

It is understood that many other surface mount arrangements can be used to provide the desired shift or tilt in peak emission beyond the embodiments described above. It is also understood that the features of the different package embodiments can be combined to achieve the desired shift in peak emission. For example, asymmetric encapsulants that cause a certain shift could be combined with any one of the embodiments having different shaped reflective cups that cause emission tilt. There are numerous different combinations that can be used according to the present invention, and it is understood that this disclose is intended to cover each of these combinations.

The displays according to the present invention can also comprise different combinations of LED packages. That is, the LED packages in the different displays do not need to all have the same features causing the tilt in emission. In some embodiments not all of the packages have a tilt in peak emission, with some of the packages emitting along the package centerline or perpendicular to the package or display. In still other embodiments, the different LED packages in the display can have a peak emission tilt in different directions, and in some embodiments the different colors in the LED display pixels can emit in different directions.

The LED packages according to the present invention can be used in many different lighting applications beyond LED displays, and in particular those using a small sized high output light sources emitting off the perpendicular axis. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

We claim:

1. A light emitting diode (LED) display, comprising:
   a plurality of LED packages, wherein at least some LED packages in the plurality of LED packages each comprise a peak emission that is angled away from a centerline of each respective LED package and wherein each of said at least some LED packages produces a respective asymmetrical field pattern off the centerline of each respective LED package, in which the plurality of LED packages are mounted within the LED display to generate an image comprising a peak emission that is angled away from a perpendicular direction of a plane of the LED display;
   wherein an angle away from the centerline varies between the at least some of said LED packages.

2. The LED display of claim 1, wherein said display is flat and the plane of said display comprises a surface of said display.

3. The LED display of claim 1, wherein said display is curved, and the plane of said display comprises a tangent plane to a surface of said display.

4. The LED display of claim 1, wherein the at least some LED packages comprise a majority of LED packages in the LED display, in which the angle away from the centerline of the peak emission for the at least some LED packages is substantially the same.

5. The LED display of claim 1, wherein the at least some LED packages comprise a reflective cup having an LED within said reflective cup, said LED shifted away from a perpendicular centerline of said reflective cup.

6. The LED display of claim 1, wherein the at least some LED packages comprise an LED mounted within a reflective cup and an encapsulant covering at least part of said reflective cup, said reflective cup shifted away from a perpendicular centerline of said LED package.

7. The LED display of claim 1, wherein the at least some LED packages comprise an LED mounted within a reflective cup and an encapsulant covering at least part of said reflective cup, said reflective cup shifted away from a centerline of said encapsulant.

8. The LED display of claim 1, wherein the at least some LED packages comprise an LED mounted within a reflective cup and an encapsulant covering at least part of said reflective cup, said reflective cup rotated within said encapsulant.

9. The LED display of claim 8, further comprising a wire lead frame at least partially within said encapsulant, wherein said wire lead frame is tilted.

10. The LED display of claim 8, further comprising a wire lead frame at least partially within said encapsulant, wherein said reflective cup and said wire lead frame are approximately on a centerline of said encapsulant.

11. The LED display of claim 1, wherein the at least some LED packages comprise an LED mounted within a reflective cup, wherein said reflective cup is asymmetric.

12. The LED display of claim 1, wherein the at least some LED packages comprise an LED mounted within a reflective cup and an encapsulant surrounding said reflective cup, wherein said encapsulant is asymmetric.

13. The LED display of claim 1, wherein the at least some LED packages comprise an LED mounted within a reflective cup, a wire lead frame, and an encapsulant surrounding said reflective cup and at least part of said wire lead frame, said encapsulant rotated about said reflective cup and wire lead frame.

14. The LED display of claim 1, wherein the plurality of LED packages comprises surface mount devices.

15. The LED display of claim 1, wherein said LED display is capable of being mounted above an intended viewer, wherein the angle away from the perpendicular direction of said peak emission of said LED display comprises an angle toward the intended viewer.

16. A light emitting diode (LED) package, comprising:
   an LED; and
   a reflective cup, wherein said LED is coupled to the reflective cup such that a peak emission from said LED package is angled away from a centerline of the LED package and wherein said LED package produces an asymmetrical field pattern off the centerline of said LED package, wherein said LED package further comprises an encapsulant at least partially covering a top surface of said reflective cup.

17. The LED package of claim 16, further comprising a lens at least partially covering said reflective cup.

18. The LED package of claim 17, wherein the positioning of said LED is away from a centerline of said reflective cup and angles the peak emission in a direction opposite to said LED's off center direction.

19. A light emitting diode (LED) package, comprising:
   an LED mounted within a reflective cup and an encapsulant at least partially covering a top surface of said reflective cup, said reflective cup positioned off a package centerline to cause a peak emission from said LED package to be angled away from the package centerline, and wherein said LED package produces an asymmetrical field pattern off the package centerline.

20. The LED package of claim 19, wherein the positioning of said reflective cup away from the package centerline angles the peak emission in a direction opposite to said reflective cup's off center direction.

21. A light emitting diode (LED) package, comprising:
   an LED mounted within a reflective cup and an encapsulant at least partially covering a top surface of said reflective cup, said encapsulant positioned off a package centerline to cause a peak emission from said LED package to be angled away from the package centerline, and wherein said LED package produces an asymmetrical field pattern off the package centerline.

22. The LED package of claim 21, wherein the positioning of said encapsulant off the package centerline angles the peak emission in a same direction as said encapsulant's off center direction.

23. A light emitting diode (LED) package, comprising:
an LED mounted within a reflective cup and an encapsulant at least partially covering a top surface of said reflective cup, said reflective cup rotated in relation to a package centerline to cause a peak emission from said LED package to be angled away from the package centerline, and wherein said LED package produces an asymmetrical field pattern off the package centerline.

24. The LED package of claim 23, wherein said encapsulant comprises a lens.

25. The LED package of claim 23, wherein said angle of said peak emission is in a same direction as said rotation of said reflective cup.

26. The LED package of claim 23, further comprising a wire lead frame at least partially within said encapsulant, wherein said wire lead frame is tilted.

27. The LED package of claim 23, further comprising a wire lead frame at least partially within said encapsulant, wherein said encapsulant and said wire lead frame are approximately on said package centerline.

28. A light emitting diode (LED) package, comprising:
an LED mounted within a reflective cup, wherein said reflective cup is asymmetric to cause a peak emission from said LED package to be angled away from a package centerline and wherein said LED package produces an asymmetrical field pattern off the package centerline, wherein said LED package further comprises an encapsulant at least partially covering a top surface of said reflective cup.

29. The LED package of claim 28, wherein said reflective cup comprises an angled reflective surface comprising at least one portion with a different angle to cause said peak emission angle.

30. The LED package of claim 28, wherein said peak emission angle is opposite said reflective cup asymmetry.

31. The LED package of claim 28, wherein said peak emission angle is in a same direction as said reflective cup asymmetry.

32. The LED package of claim 28, wherein said reflective cup comprises at least one reflective cup sidewall portion with a different height than a remainder of said reflective cup sidewall.

33. The LED package of claim 28, wherein said reflective cup comprises at least one reflective surface comprising portions with different angles of reflection.

34. The LED package of claim 28, wherein said reflective cup comprises at least one reflective surface comprising portions with different curvatures.

35. A light emitting diode (LED) package, comprising:
an LED mounted within a reflective cup and an encapsulant at least partially covering a top surface of said reflective cup, wherein said encapsulant is asymmetric to cause a peak emission from said LED package to be angled away from a package centerline, and wherein said LED package produces an asymmetrical field pattern off the package centerline.

36. The LED package of claim 35, wherein said encapsulant asymmetry comprises portions comprising different curvatures.

37. The LED package of claim 35, wherein said peak emission is opposite said encapsulant asymmetry.

38. The LED package of claim 35, wherein said peak emission is in a same direction as said encapsulant asymmetry.

39. A light emitting diode (LED) package, comprising:
an LED mounted within a reflective cup; and
an encapsulant at least partially covering a top surface of said reflective cup, said encapsulant rotated relative to a package centerline to cause a peak emission from said LED package to be angled away from the package centerline, wherein said LED package produces an asymmetrical field pattern off the package centerline.

40. The LED package of claim 39, wherein said reflective cup is on and substantially perpendicular to said package centerline.

41. The LED package of claim 39, further comprising a wire lead frame on said package centerline.

42. A display, comprising:
a plurality of emitters, at least some of which comprise a peak emission that is angled away from an emitter centerline and wherein each of said at least some of the plurality of emitters produces a respective asymmetrical field pattern off the emitter centerline of each respective emitter, said display capable of being mounted in a position off a direct line of sight of a viewer, said emitters mounted within said display to generate an image comprising a peak emission that is angled toward a direction of said viewer;
wherein an amount of angle for some of said emitters is different from that of other of said emitters.

43. The display of claim 42, wherein at least some of said emitters comprise LED packages.

44. The display of claim 42, wherein the amount of peak emission angle for each of said emitters is substantially the same.

45. The display of claim 43, wherein at least some of said LED packages comprise a reflective cup with an LED within said reflective cup, said LED shifted off a centerline of said reflective cup.

46. The display of claim 43, wherein at least some of said LED packages comprise an LED mounted within a reflective cup and an encapsulant covering at least part of said reflective cup, said reflective cup shifted off a perpendicular centerline of said LED package.

47. The display of claim 43, wherein at least some of said LED packages comprise an LED mounted within a reflective cup and an encapsulant covering at least part of said reflective cup, said reflective cup shifted off a centerline of said encapsulant.

48. The display of claim 43, wherein at least some of said LED packages comprise an LED mounted within a reflective cup and an encapsulant covering at least part of said reflective cup, said reflective cup rotated within said encapsulant.

49. The display of claim 43, wherein at least some of said LED packages comprise an LED mounted within a reflective cup, wherein said reflective cup is asymmetric.

50. The display of claim 43, wherein at least some of said LED packages comprise an LED mounted within a reflective cup and an encapsulant surrounding said reflective cup, wherein said encapsulant is asymmetric.

51. The LED display of claim 43, wherein at least some of said LED packages comprise an LED mounted within a reflective cup, a wire lead frame, and an encapsulant surrounding said reflective cup and at least part of said wire lead frame, said encapsulant rotated about said reflective cup and wire lead frame.

* * * * *

UNITED STATES PATENT AND TRADEMARK OFFICE
CERTIFICATE OF CORRECTION

PATENT NO. : 11,210,971 B2  
APPLICATION NO. : 12/498277  
DATED : December 28, 2021  
INVENTOR(S) : Chi Keung Chan et al.

Page 1 of 1

It is certified that error appears in the above-identified patent and that said Letters Patent is hereby corrected as shown below:

On the Title Page

Item (75) Inventors, replace:
"Chi Keung Chan, Sheung Shui (HK); Yue Kwong Lau, Laguna (HK); Zhang Zhikuan, Shatin (HK); Yan Xingtao, Huizhou (CN)"
With:
--Chi Keung Chan, Sheung Shui (HK); Yue Kwong Lau, Laguna (HK); Zhang Zhikuan, Shatin (HK); Yan Xingtao, Huizhou (CN); Liu Hao, Huizhou (CN); Fei Xiang, Huizhou (CN)--

Signed and Sealed this  
Eighth Day of March, 2022

Drew Hirshfeld  
*Performing the Functions and Duties of the*  
*Under Secretary of Commerce for Intellectual Property and*  
*Director of the United States Patent and Trademark Office*